(12) United States Patent
Alissa et al.

(10) Patent No.: US 10,667,435 B1
(45) Date of Patent: May 26, 2020

(54) ACCELERATED RACK ACCLIMATOR

(71) Applicant: Microsoft Technology Licensing, LLC, Redmond, WA (US)

(72) Inventors: Husam Alissa, Redmond, WA (US); Roy Medhi Zeighami, Fall City, WA (US); Scot Edward Heath, Issaquah, WA (US); Brandon Aaron Rubenstein, Issaquah, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/355,703

(22) Filed: Mar. 15, 2019

(51) Int. Cl.
*H05K 7/20* (2006.01)
*G06F 1/20* (2006.01)

(52) U.S. Cl.
CPC ..... *H05K 7/20727* (2013.01); *H05K 7/20836* (2013.01); *G06F 1/20* (2013.01)

(58) Field of Classification Search
CPC .......... H05K 7/20745; H05K 7/20836; H05K 7/20736; H05K 7/2079; H05K 7/1488; H05K 7/20145; H05K 7/20209; H05K 7/207; F24F 2110/20; F24F 3/1405; F24F 13/222; G06F 1/206; G06F 1/20; G06F 11/3058; G06F 11/3089

USPC .. 361/695, 692, 679.5, 691, 679.48, 679.49; 165/230, 247, 252, 279, 287
See application file for complete search history.

(56) References Cited

U.S. PATENT DOCUMENTS 10,264,715 B1 * 4/2019 Ortega Gutierrez ........................ H05K 7/20836

* cited by examiner

*Primary Examiner* — Mandeep S Buttar
(74) *Attorney, Agent, or Firm* — Watson Patents, PLC; Vladan M. Vasiljevic

(57) ABSTRACT

A rack acclimating device can accelerate the acclimation of an already assembled rack of computing equipment to an environment. A rack acclimating device can comprise one or more heating elements and an air moving device that can be oriented to move air across the heating elements and then through the rack of computing equipment. Additionally, the rack acclimating device can comprise a controller or other like computing device that can receive environmental sensor data and, based upon the received environmental sensor data, can control the heating elements and air moving device. Environmental sensor data can be received from environmental sensors, such as temperature and/or humidity sensors, which can be positioned to sense various environmental aspects. A rack acclimating device can also comprise a hood or other like structure to confine and direct the heated air from the heating elements and/or air moving device to the computer equipment rack.

20 Claims, 7 Drawing Sheets

ACCELERATED RACK ACCLIMATOR

BACKGROUND

Increasingly, computing functionality need not be supported by hardware that is physically co-located with a user utilizing such a computing functionality, but rather can be supported by networked computing hardware aggregated into large data centers that are physically remote from the user. Often, the utilization of such computing functionality is referred to as "cloud computing" and can provide users with computing functionality that is typically supported by virtual machines hosted by large collections of computing hardware providing stability, redundancy, and high availability.

A modern data center represents a large financial investment, both in computing device hardware, and also in the hardware providing the relevant support systems for such computing devices. For example, data centers often comprise climate control hardware, redundant power systems, physical security, and other like support systems, in addition to the computing device hardware itself, which, can comprise thousands of computing devices, storage devices, networking devices, and other like computing device hardware. Often, computing device hardware is housed in physical support structures known as "racks". While the individual computing device hardware housed in such racks can be installed locally, at the data center where such computing hardware will be powered up and utilized, often computing hardware is installed into racks remotely and shipped to a data center with the racks and the computing hardware housed therein already fully assembled and ready to be plugged in, powered on and utilized.

Because of the large quantities of computing device hardware housed in a typical data center, even small improvements in the reliability of such computing device hardware can mean thousands of fewer hardware failures, with attendant cost savings and service reliability improvements. Additionally, reducing the time between when fully assembled racks of computer equipment are received by a data center, and the time when such racks are connected to the electrical power and activated, can additionally result in substantial cost savings, including the monetary benefits of having such computing equipment being operational and supporting profit generating services more quickly. In some instances, the reliability of computing device hardware can be negatively impacted by moisture, which can corrode metallic surfaces, short circuit electrical pathways, and otherwise disrupt the proper functioning of computing equipment. To reduce the negative impact of moisture, assembled racks of computing equipment are often left unutilized for extended periods of time to provide for acclimation to the environment of the data center, since such racks of computing equipment are often shipped through, and spend significant time in, environments that differ substantially from the environment of the data center, including environments that may be more humid than the environment of the data center, environments that may be substantially colder than the environment of the data center, and other like environmental differences.

SUMMARY

A rack acclimating device can accelerate the acclimation of an already assembled rack of computing equipment to an environment, such as of a data center, thereby reducing the amount of time elapsing between receipt of the rack of computing equipment and the powering on and utilization of such computing equipment, with the attendant monetary benefits indicated above, while simultaneously decreasing the quantity of hardware failures due to improper acclimation or other moisture-driven, or environment-driven, failures. A rack acclimating device can comprise one or more heating elements and an air moving device that can be oriented to force air across the heating elements and then through the rack of computing equipment. In some instances, the heating elements and air moving device can be a single unit in the form of a forced air heater. Additionally, the rack acclimating device can comprise a controller or other like computing device that can receive environmental sensor data and, based upon the received environmental sensor data, can control the heating elements and air moving device to either increase, decrease, or deactivate the operation of the heating elements, and, likewise, either increase, decrease, or deactivate the operation of the air moving device. Environmental sensor data can be received from environmental sensors, such as temperature and/or humidity sensors, which can be positioned to sense various environmental aspects. For example, environmental sensors can be positioned proximate to one or more computing devices, or other computing equipment, installed within the rack being acclimated. Other environmental sensors can be positioned within the data center. Still other environmental sensors can be positioned so as to sense environmental factors of air being forced into the computer equipment rack by the rack acclimating device, and of air exiting the computer equipment rack. A rack acclimating device can also comprise a hood or other like structure to confine and direct the heated air from the heating elements and/or air moving device to the computer equipment rack. For example, such a hood can comprise a first opening having a size and shape appropriate for configuring with the heating elements and/or air moving device, and a second opening having a size and shape appropriate for configuring with the computer equipment rack, such as a size and shape that is governed by relevant computer equipment rack sizing standards. Additionally, such a hood can comprise attachment mechanisms, such as latches or magnets, by which it can be attached, and then subsequently detached, from a computer equipment rack. Such a hood can also comprise air sealing capabilities, such as a gasket or other like sealing device. In some instances, a rack acclimating device can supplement the air moving functionality of an external air moving device by utilizing fans, or other like air moving devices, that are already part of the computing equipment installed in the computer equipment rack. To avoid risking more valuable computing equipment, such fans can be powered independently of other computing equipment within the rack. The air moving device of a rack acclimator can be arranged to draw sufficiently dry air and move such dry air across the heating elements. Optionally, the heating elements can be supplemented, or replaced, by utilizing already heated air, such as the air available in the hot aisle of data centers. In such instances, dehumidification devices, including active and/or passive dehumidification devices, can be part of the rack acclimating device.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Additional features and advantages will be made apparent from the following detailed description that proceeds with reference to the accompanying drawings.

DESCRIPTION OF THE DRAWINGS

The following detailed description may be best understood when taken in conjunction with the accompanying drawings, of which.

DETAILED DESCRIPTION

Figure 1:
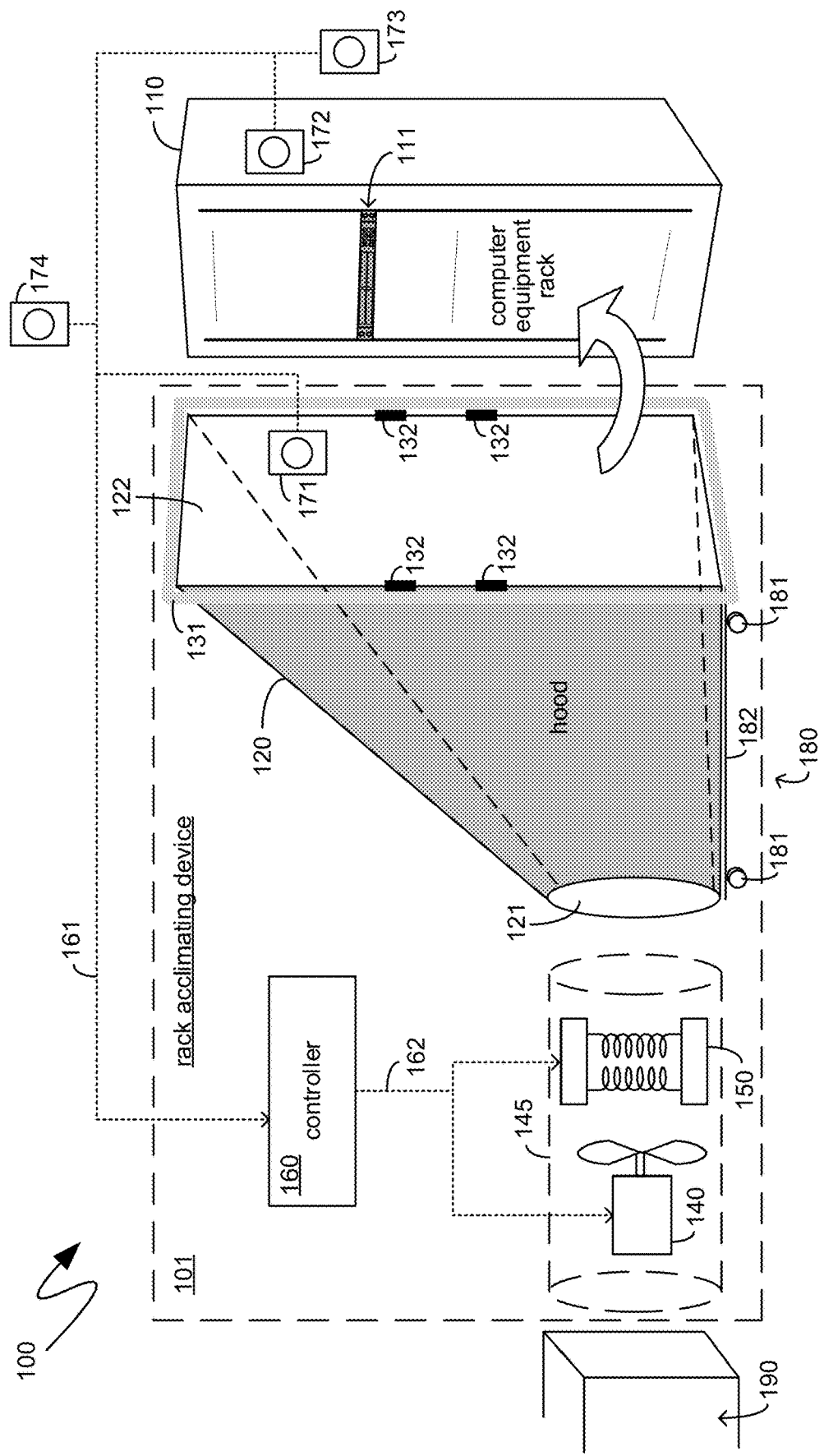
FIG. 1 is a diagram of an exemplary accelerated rack acclimator.

The following description relates to the acceleration of the acclimation of a rack of computing devices to an environment within which the rack and the computing devices will be utilized, such as a data center. A rack acclimating device can accelerate the acclimation of an already assembled rack of computing equipment to an environment, such as of a data center, thereby reducing the amount of time elapsing between receipt of the rack of computing equipment and the powering on and utilization of such computing equipment, with the attendant monetary benefits indicated above, while simultaneously decreasing the quantity of hardware failures due to improper acclimation or other moisture-driven, or environment-driven, failures. A rack acclimating device can comprise one or more heating elements and an air moving device that can be oriented to force air across the heating elements and then through the rack of computing equipment. In some instances, the heating elements and air moving device can be a single unit in the form of a forced air heater. Additionally, the rack acclimating device can comprise a controller or other like computing device that can receive environmental sensor data and, based upon the received environmental sensor data, can control the heating elements and air moving device to either increase, decrease, or deactivate the operation of the heating elements, and, likewise, either increase, decrease, or deactivate the operation of the air moving device. Environmental sensor data can be received from environmental sensors, such as temperature and/or humidity sensors, which can be positioned to sense various environmental aspects. For example, environmental sensors can be positioned proximate to one or more computing devices, or other computing equipment, installed within the rack being acclimated. Other environmental sensors can be positioned within the data center. Still other environmental sensors can be positioned so as to sense environmental factors of air being forced into the computer equipment rack by the rack acclimating device, and of air exiting the computer equipment rack. A rack acclimating device can also comprise a hood or other like structure to confine and direct the heated air from the heating elements and/or air moving device to the computer equipment rack. For example, such a hood can comprise a first opening having a size and shape appropriate for configuring with the heating elements and/or air moving device, and a second opening having a size and shape appropriate for configuring with the computer equipment rack, such as a size and shape that is governed by relevant computer equipment rack sizing standards. Additionally, such a hood can comprise attachment mechanisms, such as latches or magnets, by which it can be attached, and then subsequently detached, from a computer equipment rack. Such a hood can also comprise air sealing capabilities, such as a gasket or other like sealing device. In some instances, a rack acclimating device can supplement the air moving functionality of an external air moving device by utilizing fans, or other like air moving devices, that are already part of the computing equipment installed in the computer equipment rack. To avoid risking more valuable computing equipment, such fans can be powered independently of other computing equipment within the rack. The air moving device of a rack acclimator can be arranged to draw sufficiently dry air and move such dry air across the heating elements. Optionally, the heating elements can be supplemented, or replaced, by utilizing already heated air, such as the air available in the hot aisle of data centers. In such instances dehumidification devices, including active and/or passive dehumidification devices, can be part of the rack acclimating device.

With reference to FIG. 1, an exemplary system 100 is illustrated, providing context for the descriptions below. The exemplary system 100 includes a rack, such as the exemplary computer equipment rack 110. The exemplary computer equipment rack 110 can comprise any type of frame or support system that can accommodate, support and house multiple computing devices, such as the exemplary computing device 111, and associated support devices, such as fans, power supplies, monitoring equipment, access panels, display glass, and the like. For example, the exemplary computer equipment rack 110 can be a server rack conforming to various standards such as the EIA-310 standard, the IEC 60297 standard, and other like standards. As will be recognized by those skilled in the art, such standards typically define rack frames that are 19 or 23 inches wide and have mounting holes to accommodate equipment that is a multiple of approximately 1.75 inches high. Computing equipment designed to be mounted in such racks is often referenced based on the height of such equipment as being a multiple of the "rack unit", often abbreviated by the letter "U". Thus, for example, computing equipment can be referenced as being "1U", "2U", and so forth. Additionally, rack themselves are often referenced based on the total height of the computing equipment that can be installed in such a rack, such as a "42U" or "48U" rack.

Typically, racks, such as exemplary server rack 110, house multiple computing devices, often in the context of larger computing environments such as datacenters comprising hundreds or thousands of such racks. The environmental conditions within such datacenters can be monitored, such as by one or more environmental sensors placed throughout a data center. However, when such racks first arrive, the environmental conditions inside of computing devices mounted within such racks and the environmental conditions inside of the racks themselves can differ meaningfully from the environmental conditions of the data center itself. For example, racks that have been shipped to the data center through cold weather can often be received at the data center with temperatures of the computer equipment within the rack being quite cold. By contrast the environmental conditions of the data center can be significantly warmer. In such instances, when the warm air of the data center passes over the cold computer equipment, water from the warm air of the data center can condense onto the cold computer equipment. Such water can short out the computer equipment once electrical power is applied thereto, can cause corrosion, rust, or other like undesirable chemical effects, and can otherwise negatively impact the reliability and longevity of such computer equipment. As a specific example, the dewpoint of a climate-controlled data center can be as high as 40° F. or more. By contrast, computer equipment racks shipped during winter can arrive with the temperature of the computer equipment within the rack being as low as 20° F. or less. Since the temperature of the computer equipment can be 20° F. or more below the dewpoint of the data center environment in which the rack will be installed and utilized, water condensate will form on such cold computer equipment.

Environmental discrepancies can also arise when racks of computing equipment are received at a data center after having been shipped through warm weather. For example, racks shipped through warm weather can be received at the data center with temperatures and dew points of air pockets within the rack that can be quite high. By contrast, the temperature of the data center can be meaningfully cooler. As the rack and the computer equipment installed thereon are cooled to the temperature of the data center, if such air pockets within the rack are not dealt with through acclimation of the rack, the rack and the computer equipment installed thereon can be cooled below the dew points of such air pockets, again causing water to condense onto the computer equipment. As before, the presence of water on the computer equipment can negatively impact the reliability and longevity of such computer equipment. As a specific example, computer equipment racks that have been shipped during summertime can arrive with pockets of air within the racks whose viewpoint can be as high as 70° F. or more. By contrast, the temperature of climate control datacenters can be 60° F. or less. If the computing devices installed in such a rack are cooled to the temperature of the data center, they can be 10° F. or more cooler than the dewpoint of the aforementioned air pockets, which can cause water condensate from such air pockets to condense onto such computing devices.

Typically, to avoid such negative environmental results, racks of computing equipment that are received by datacenters are first acclimated to the environment of the data center by allowing such racks to sit unused for as long as a day or more before being connected to electrical power, powered on and utilized. As indicated previously, such a delay in the utilization of the computing equipment installed on such a rack can be costly in terms of lost revenue and profit from services that either could not be offered during that time, or which could not be offered as efficiently, reliably, or expeditiously during that time.

Accordingly, according to one aspect, to accelerate the acclimation of a rack of computing devices to an environment within which such a rack, and the computer equipment installed thereon, will be utilized, a rack acclimating device can be utilized. Turning back to FIG. 1, the exemplary system 100 illustrates a rack acclimating device, such as the exemplary rack acclimating device 101, being utilized in conjunction with the computer equipment rack 110. According to one aspect, a rack acclimating device, such as the exemplary rack acclimating device 101, can comprise a hood, such as the exemplary hood 120. A hood, such as the exemplary hood 120, can control and focus forced air onto the computer equipment rack 110. For example, the hood 120 can comprise an opening 122 that can be sized for the computer equipment rack 110. More specifically, the opening 122 can be sized in accordance with standard computer equipment rack sizing. As indicated previously, various standards can define the dimensions of a computer equipment rack, such as the exemplary computer equipment rack 110. For example, the height of the opening 122 can conform to standard computer equipment rack heights, including the commonly utilized 42U and 48U height racks. Similarly, the width of the opening 122 can conform to standard computer equipment rack widths, such as the aforementioned 19 or 23 inch wide frame width racks. The needs of the data center, or other like environment within which the rack acclimating device 101 will be utilized, can define the specific size of the opening 122. For example, if a data center only purchases computer equipment racks having 19 inch wide frames and being 42U in height, then only a single hood, having an opening 122 conforming to such a computer equipment rack size, may be sufficient. As another example, if the computer equipment racks being utilized are either 42U or 48U in height, then multiple hoods can be utilized, such as one hood having an opening 122 conforming to a computer equipment rack having a 42U height, and another hood having an opening 122 conforming to a computer equipment rack having a 48U height.

As yet another example, the opening 122 can be variably sized. For example, the hood 120 can be constructed from a flexible material, such as canvas, synthetic fibers, plastic sheeting or the like. The opening 122 can be constructed by arranging such flexible material around a frame that is sized in the manner indicated above. Such a frame can be an expandable frame, or otherwise a variably-sized frame, whose size can vary in a predefined manner. For example, such a frame can be expandable from a height of 42U to a height of 48U. As another example, such a frame can be expandable from a width corresponding to a 19-inch wide rack frame to a width corresponding to a 21-inch wide rack frame. Still other variably sized frames can be utilized so that the opening 122 can accommodate multiple different sizes of computer equipment racks.

To facilitate the utilization of multiple hoods, a hood, such as the exemplary hood 120, can be mounted upon, or otherwise attached to, or supported by, a frame, such as the exemplary frame 180. As illustrated in FIG. 1, the exemplary frame 180 can comprise wheels, such as the exemplary wheels 181, which can facilitate the movement of the frame 180 and, correspondingly, the hood 120. The exemplary frame 180 can, optionally, further comprise a frame base, such as the exemplary base 182 to which the exemplary hood 120 can be attached, or can otherwise be supported by, and to which the exemplary wheels 181 can be attached.

In addition to comprising an opening, such as the exemplary opening 122, which can be sized to correspond to the size of a computer equipment rack, such as the exemplary computer equipment rack 110, a hood, such as the exemplary hood 120, can further comprise attachments by which the hood 120 can be attached to the computer equipment rack 110. For example, the hood 120 can comprise one or more magnets, such as the exemplary magnets 132, or other like magnetic attachment mechanisms, which can facilitate the attachment, and detachment, of the hood 120 to and from the computer equipment rack 110. As another example, although not specifically illustrated by the exemplary system 100 of FIG. 1, the hood 120 can comprise latches, hooks, hook-and-loop, tape, or other like attachment mechanisms by which the hood 120 can be attached to, and detached from, the computer equipment rack 110.

The exemplary opening 122 can be surrounded by a sealing peripheral structure, such as the exemplary seal 131. The seal 131 can provide further direction and focusing of air movement through the hood 120 onto the computer equipment rack 110. For example, the seal 131 can be constructed of foam, rubber, vinyl, plastic, or other like sealing material. Although illustrated separately in FIG. 1, the attachment mechanism and seal can be a single physical structure. For example, the seal 131 could be a rubber-coated magnet, thereby providing the functionality of both the seal 131 and the magnets 132.

As shown in FIG. 1, the exemplary hood 120 can comprise another opening, such as the exemplary opening 121, through which air, directed by the hood 120 onto the computer equipment rack 110, can enter the hood 120. The opening 121 can be positioned on an opposite side of the hood 120 from the aforedescribed opening 122. Alternatively, it can be positioned adjacent thereto, in which case the hood 120 can change the direction of the movement of the air being forced through it. The opening 121 can be sized to correspond to a source of heated air that will be directed through the hood 120 onto the computer equipment rack 110.

The exemplary rack acclimating device 101 shown in FIG. 1 can comprise both a heating element, such as the exemplary heating element 150, and an air mover, such as the exemplary air mover 140. A rack acclimating device can comprise a single heating element, or multiple heating elements, which can be all housed together, or separately. Such heating elements can include ceramic heaters, coil heaters, resistance-based heaters, propane heaters, natural gas heaters, and other like heating elements. The rack acclimating device can also comprise one or more air movers, such as fans. A single device, such as the exemplary device 145, can comprise both air movers, such as the exemplary air mover 140, and one or more heating elements, such as the exemplary heating element 150.

To acclimate the computer equipment rack 110 in an accelerated manner, a large volume of air may be required. Accordingly, the air mover 140 can be sized to provide a sufficient quantity of air movement. For example, the air mover 140 can be sized to provide a maximum air flow of 2000 CFM. Other maximum airflow amounts can, likewise, be established for purposes of selecting one or more air movers, such as the exemplary air mover 140.

While a large volume of air may be required, accelerated acclimation of a computer equipment rack may not require particularly high temperatures. Instead, the heating elements, such as the exemplary heating elements 150, may only need to provide warm, as opposed to hot, air. For example, an air temperature of 120° F. can be maintained to accelerate acclimation of the computer equipment rack 110.

The exemplary rack acclimating device 101 can further comprise a controller, such as the exemplary controller 160. The exemplary controller 160, as illustrated by the control coupling 162, can control one or more of the air mover 140 and/or the heating element 150. For example, the controller 160 can control the provision of electrical power to one or more of the air mover 140 and/or the heating element 150 in order to activate or deactivate their operation. As another example, the air mover 140 can be variable speed, which can be selected based on input voltage, input electrical pulse width modulation frequency, or other like variable control inputs, which can be generated by the controller 160 to increase or decrease the quantity of air moved by the air mover 140. Similarly, the heating element 150 can have variable heat generation capability, which can be selected based upon input voltage, input current, input electrical pulse width modulation frequency, or other like variable control inputs, which can also be generated by the controller 160 to increase or decrease the quantity of heat generated by the heating element 150.

The controller 160 can receive input from one or more environmental sensors, and the control outputs 162, directed to one or more of the air mover 140 and/or the heating element 150, can be based upon the inputs 161 received from those environmental sensors. Environmental sensors, such as the exemplary environmental sensors 171, 172, 173 and 174 can sense one or more of the temperature and/or humidity of the air surrounding the environmental sensor. The control provided by the controller 160 can be based upon the location of the environmental sensors and the data they provide.

For example, according to one aspect, the controller 160 can control the acclimation of the computer equipment rack 110 based upon a temperature of the computer equipment rack, and the computing devices installed therein. In such an example, the environmental sensor 172 can be one or more temperature sensors positioned throughout the computer equipment rack 110. Upon the controller 160 detecting that the temperature being sensed by such temperature sensors has reached a threshold, the controller 160 can decrease or deactivate the operation of one or more of the air mover 140 and/or the heating element 150. For example, a threshold temperature can be a temperature above the dewpoint of the environment for which the computer equipment rack 110 is being acclimated. Once the temperature of the computer equipment rack 110, and the computing devices installed therein, have reached such a temperature, the risk of condensation of water onto such computing devices can be minimized. As another example, a threshold temperature can be a temperature based upon the dewpoint of the environment for which the computer equipment rack 110 is being acclimated, such as, for example, the threshold temperature can be 10° F. above the dewpoint of that environment.

The dewpoint of the environment for which the computer equipment rack 110 is being acclimated can be directly sensed, derived, or estimated based upon previously acquired empirical data. For example, the environmental sensor 174 can be positioned to sense a temperature or humidity of an environment for which the computer equipment rack 110 is being acclimated. The environmental sensor 174 can be a temperature sensor that can sense the temperature of the environment for which the computer equipment rack 110 is being acclimated. A corresponding dewpoint can then be estimated based upon the directly-sensed temperature. Conversely, the environmental sensor 174 and be a combination of a temperature and humidity sensor from which the dewpoint can be directly derived. As yet another example, rather than utilizing data from an environmental sensor, such as the exemplary environmental sensor 174, previous empirically obtained data, either from the environment itself, or from other like environments, can be utilized to estimate the dewpoint or to otherwise select an appropriate threshold temperature. For example, if historical data indicates that the temperature and humidity levels of climate-controlled datacenters rarely exceed dew points of 60° F., then a threshold temperature of, for example, 70° F. can be established.

According to another aspect, the controller 160 may not be able to directly obtain environmental information from inside the computer equipment rack 110. In such an instance, the controller 160 may base the control outputs 162 upon a differential between one or more environmental sensors, such as the exemplary environmental sensor 171, which can be positioned along in airflow path into the computer equipment rack 110 and prior to reaching the computer equipment rack 110, and one or more environmental sensors, such as the exemplary environmental sensor 173, which can be positioned in the airflow coming out of the computer equipment rack 110. A differential between such inputs can then be utilized to indirectly detect when the computer equipment rack 110, and the computing devices installed thereupon, have achieved a target temperature. For example, an increased temperature differential between, for example, the environmental sensor 171 and the environmental sensor 173 can be indicative of heat still being absorbed by the computer equipment rack 110, and the computing devices installed thereupon. By contrast, a decreased temperature differential between the environmental sensor 171 in the environmental sensor 173 can be indicative that heat is no longer being absorbed and that the corresponding rack, and its associated devices, have reached the target temperature.

As indicated previously, acclimation of a computer equipment rack can seek to minimize the negative impact of moisture affects on the computing devices. Accordingly, the air being utilized to acclimate the computer equipment rack 110 can be dry air. Such dry air can be obtained through passive dehumidification, such as silica-based passive dehumidifiers, active dehumidification, such as provided by compressor-based air conditioning, or by utilizing air that is already dry, such as outside air for datacenters located in environments that experience cold, dry weather. The exemplary system 100 of FIG. 1 illustrates ducting in the form of the exemplary ducting 190, which can provide outside air, heated air, such as from a hot aisle of the data center, or other like remote-origin air to an input of either the forced air heater 145, or the opening 121 of the hood 120.

Figure 2:
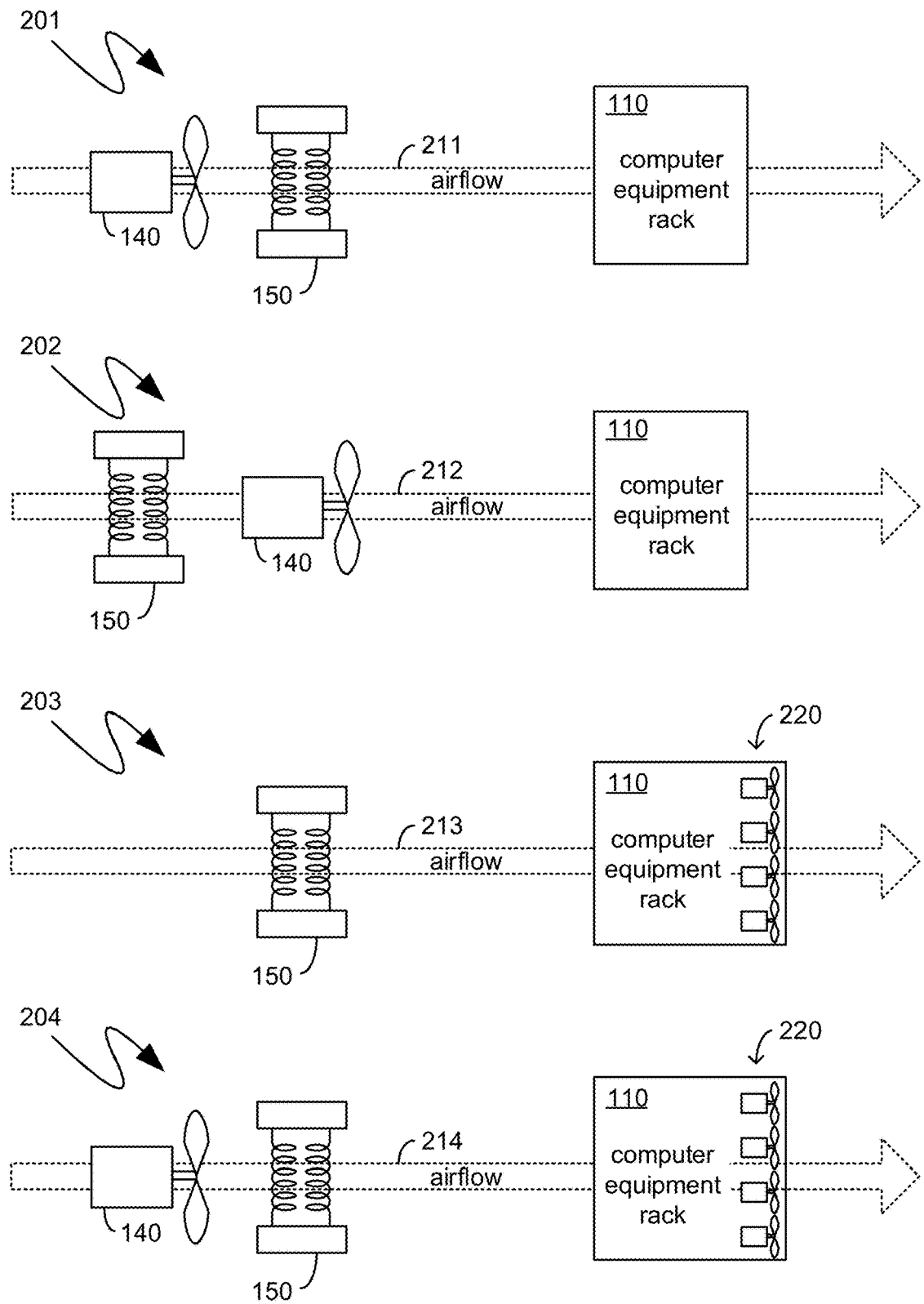
FIG. 2 is a diagram of various exemplary airflow arrangements of components of exemplary accelerated rack acclimators.

Turning to FIG. 2, the exemplary system 201 illustrates one exemplary airflow 211 through the computer equipment rack 110. More specifically, the exemplary air mover 140 can be positioned to generate the airflow 211 and force the air flow through the exemplary heating element 150 and then continue to force the now heated airflow through the computer equipment rack 110. The exemplary system 202 illustrates another exemplary airflow 212 through the computer equipment rack 110. In the exemplary system 202, the airflow 212 can be generated by the exemplary air mover 140, which can be positioned to across the exemplary heating element 150, then past the exemplary air mover 140, and onto the computer equipment rack 110.

Exemplary systems 203 and 204, shown in FIG. 2, illustrate aspects in which air moving devices that are installed as part of the computing devices of the computer equipment rack 110 are utilized to either generate airflow, or supplement the generation of airflow. More specifically, in the exemplary system 203, the airflow 213 can be generated, not by an external air mover, but rather by the air moving devices that are installed as part of the computing devices of the computer equipment rack 110, illustrated as the exemplary air moving devices 220. In such an instance, the airflow 213, generated by the exemplary air moving devices 220, can be pulled across the exemplary heating element 150 and through the computer equipment rack 110. In the exemplary system 204, the airflow 214 can be generated by an external air mover 140, and can be supplemented by the exemplary airflow devices 220 that can be installed as part of the computing devices of the computer equipment rack 110. Although the exemplary air mover 140 is illustrated as pushing air across the exemplary heating element 150 in the exemplary system 204, the air mover 140 could equally be oriented to pull the air across the heating element 150, such as in the exemplary system 202.

Figure 3:
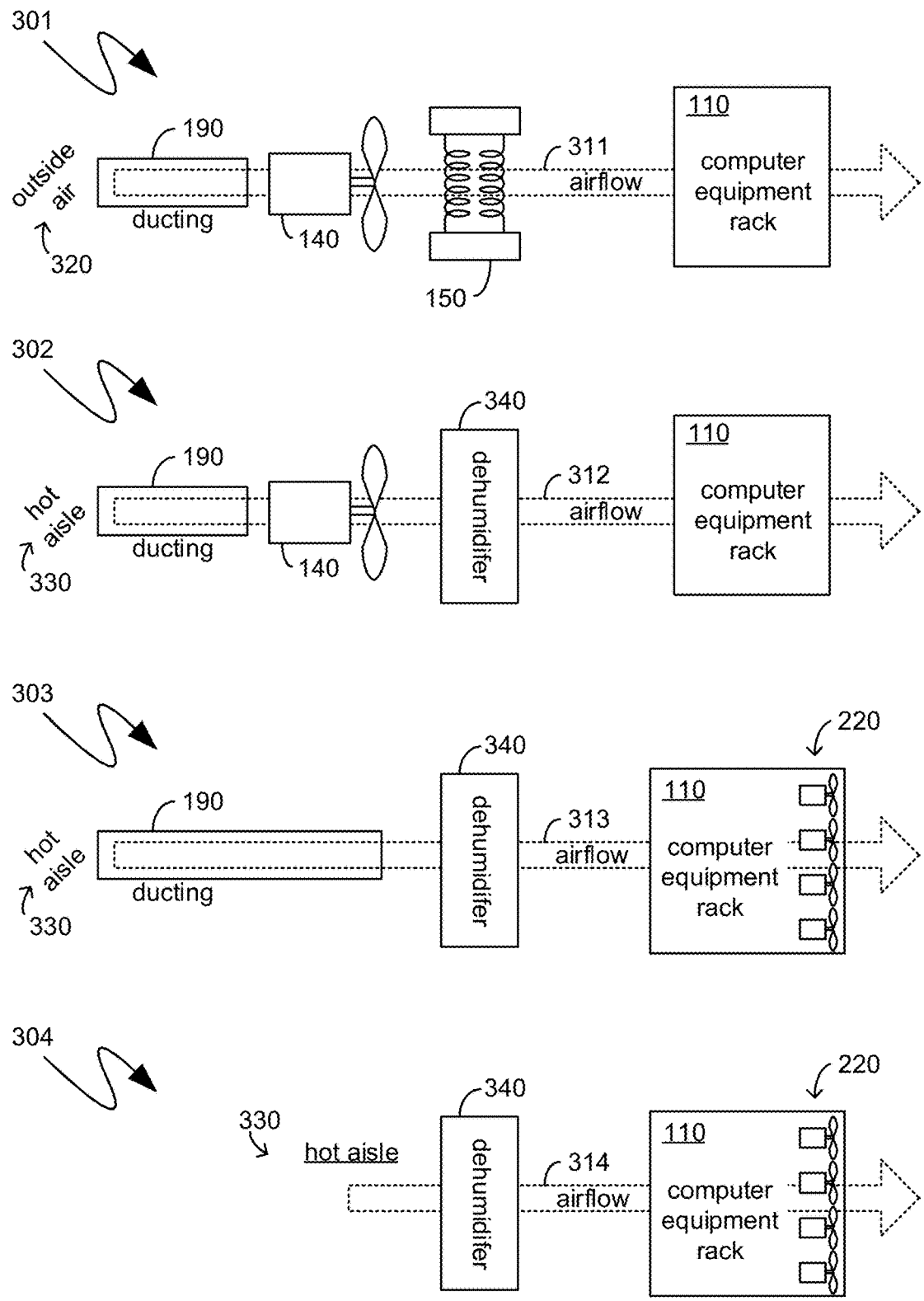
FIG. 3 is a diagram of further various exemplary airflow arrangements of components of exemplary accelerated rack acclimators.

Turning to FIG. 3, the exemplary system 301 illustrates an exemplary airflow 311 that can be generated by the exemplary air mover 140 drawing in outside air 320 through ducting 190. As indicated previously, such outside air 320 can be cool, dry air which, upon being heated by the heating element 150, can be warm dry air, which can increase the temperature of the computer equipment rack 110, and the devices installed thereon, as well as drying out the rack and the devices. According to another aspect, however, the airflow generated by the air mover need not be sourced from the outside air 320 and can, instead, be sourced from air that is already warm. For example, the exemplary system 302 illustrates an exemplary airflow 312 that can be generated by the exemplary air mover 140 drawing air from the hot aisle 330 through the ducting 190. The hot aisle 330 can be any area into which heat from other, already operational computing devices, or from other heat-generating sources, such as power supplies, power generators, and the like, is exhausted. Typically, the warm air of a hot aisle, such as the exemplary hot aisle 330, can be drawn into climate control systems to be subsequently cooled and recirculated as cooled air. However, in the exemplary system 302, the ducting 190 can enable the air mover 140 to draw air from the hot aisle 330 and direct it through the computer equipment rack 110. The air drawn from the hot aisle 330 may be sufficiently warm that a heating element, such as the exemplary heating element 150, need not be necessary, or utilized. However, the warm air from the hot aisle 330 may have too high a humidity. Accordingly, a dehumidifier, such as the exemplary dehumidifier 340 can be inserted into the airflow 312 prior to the computer equipment rack 110. As indicated previously, a dehumidifier, such as the exemplary dehumidifier 340, can be an active dehumidifier and/or a passive dehumidifier, such as a dehumidification substance across which the airflow 312 is directed.

Additionally, as indicated previously, air moving devices that are installed as part of the computer equipment in the exemplary computer equipment rack 110, such as the exemplary air moving devices 220, can be utilized to generate, or supplement, the generation of airflow across the computer equipment rack 110. For example, the exemplary system 303 illustrates an exemplary airflow 313 being generated by the exemplary air moving devices 220 that are installed as part of the computing equipment in the exemplary computer equipment rack 110. If the airflow 313 is sourced from the hot aisle 330, such as through the ducting 190, not only can the heating element 150 be eliminated, but the external air mover 140 can also, optionally, be eliminated, leaving the airflow 313 only passing through the ducting 190 and the dehumidifier 340, as illustrated in FIG. 3. As yet another example, if the computer equipment rack 220 is placed within the hot aisle 330, the ducting 190 can also be eliminated. Thus, for example, the exemplary system 304 illustrates the computer equipment rack 110 being placed in the hot aisle 330 and the airflow 314, being generated by the air mover devices 220 of the computing devices in the computer equipment rack 110 drawing the hot aisle air through a dehumidifier 340 and then the computer equipment rack 110.

As indicated previously, one impetus for the acclimation of a computer equipment rack to an environment within which it will be utilized, such as the environment of a data center, is to avoid the condensation of liquid onto computing devices where such liquid can short-circuit such devices, cause corrosion, or otherwise decrease the availability and reliability of such computing devices. Accordingly, according to one aspect, nothing on a computer equipment rack is provided electrical power until the computer equipment rack has been acclimated. According to another aspect, however, discrete components of the computer equipment rack can be provided with electrical power, with the attendant moisture-related risks being attenuated by limiting such components to inexpensive components and/or components whose functionality can be easily supplemented or replaced. Additionally, further risk mitigation can be obtained by providing electrical power to such components through a dedicated electrical power supply that is otherwise not needed by other components, such that the entire electrical path can be fungible should a failure occur.

Figure 4:
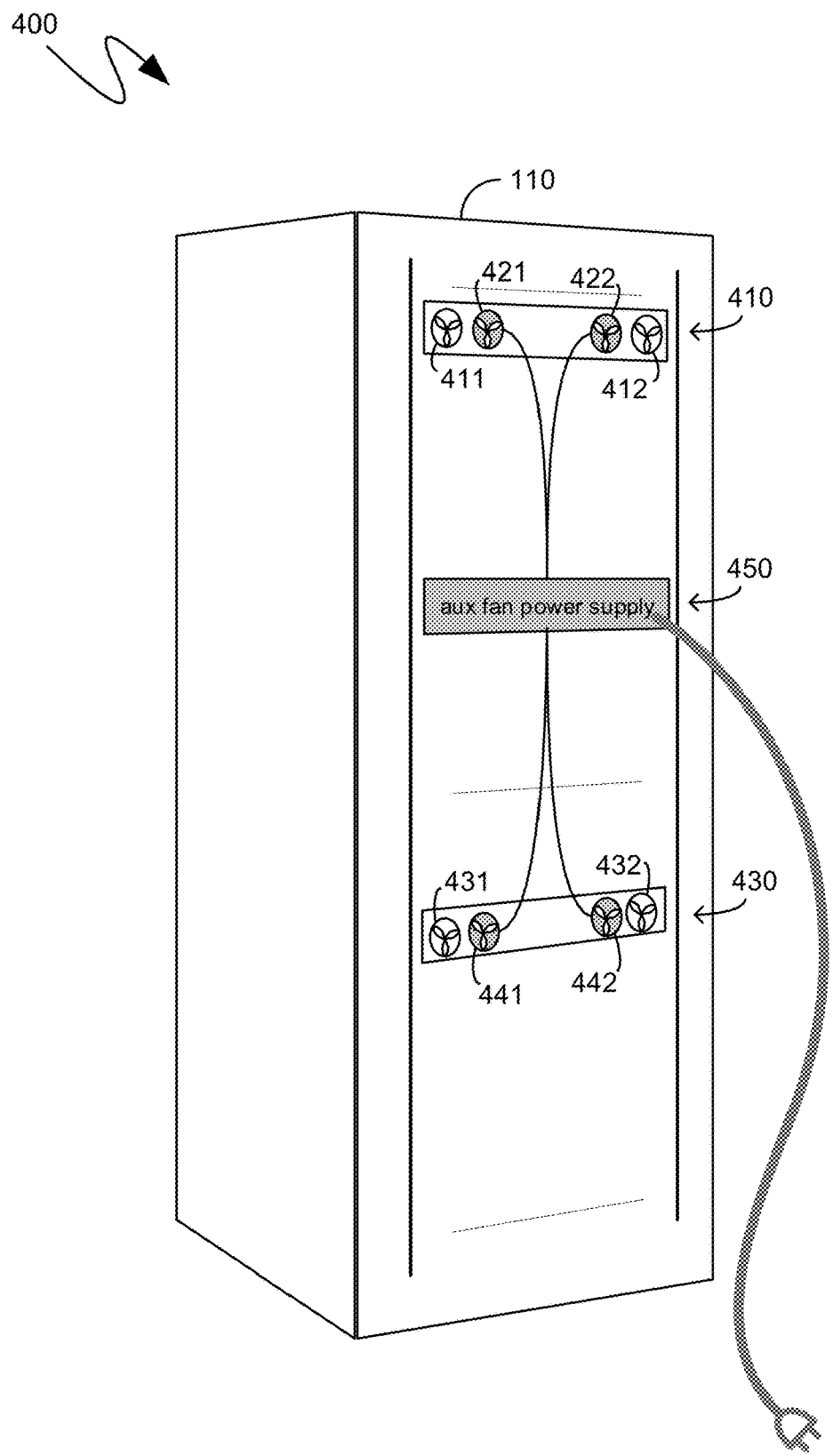
FIG. 4 is a diagram of exemplary air movers installed in a computer equipment rack.

Turning to FIG. 4, an exemplary system 400 shown therein illustrates supplemental air moving devices that can be installed as part of the computing equipment in the exemplary rack 110. For example, a server computing device, such as a rack mount blade server computing device, can comprise one or more fans to cool the components of such a blade server computing device, including the processing units, networking components, storage components and other like components of a blade server computing device. Often such rack mount blade server computing devices can have one or two fans positioned at the back of the rack mount server blade computing device. For example, in FIG. 4, the exemplary blade server computing device 410 is illustrated as comprising two fans, namely the exemplary fans 411 and 412. According to one aspect, additional fans, such as the exemplary fans 421 and 422, can be part of the exemplary blade server computing device 410. The additional fans 421 and 422 can be similar to the fans 411 and 412, except that they can be powered by a separate power supply that is separate from the power supply of the exemplary blade server computing device 410, which can power the the other components of the exemplary blade server computing device 410. According to another aspect, the additional fans 421 and 422 can be similar to the fans 411 and 412, except that, should the fans 421 and 422 fail, the fans 411 and 412 can provide sufficient cooling to the exemplary server computing device 410. According to yet another aspect, the additional fans 421 and 422 can be necessary fans for the exemplary server computing device 410, except that they can be positioned such that they can be easily replaced should they fail. Combinations of the above are equally contemplated.

Accordingly, the exemplary fans 421 and 422 can be utilized to supplement, and/or provide, airflow to accelerate the acclimation of the rack 110, such as in the manner described above. While operating the fans 421 and 422 prior to the acclimation of the rack 110 can expose the fans 421 and 422 to moisture-based risks, such as those detailed above, if the exemplary fans 421 and 422 fail due to such moisture-based risks, the negative aspects of such failures can be mitigated. For example, if the fans 421 and 422 are supplemental, then their failure can be immaterial to the proper operation of the exemplary blade server computing device 410. Similarly, if the fans 421 and 422 can be easily replaced, then their failure can be inexpensively mitigated.

To protect the power supplies of computing devices, or other like electrically powered devices installed within the rack 110, an auxiliary power supply, such as the exemplary power supply 450, can provide power only to the fans 421 and 422. In such an instance, the entire electrical path that is active within the exemplary rack 110, prior to the acclimation of such a rack 110, can be the electrical paths illustrated by the gray components in FIG. 4, namely the electrical path passing only through the power supply 450 and the fans 421 and 422. According to one aspect, the singular power supply 450 can provide power to multiple such fans utilized to supplement or provide airflow for acclimation purposes. Thus, for example, the exemplary blade server computing device 430 can also comprise fans 431 and 432, and additional fans 441 and 442 which can be utilized to supplement or provide airflow for acclimation purposes. In such an example, power to the fans 441 and 442 can also be sourced from the exemplary power supply 450.

Figure 5:
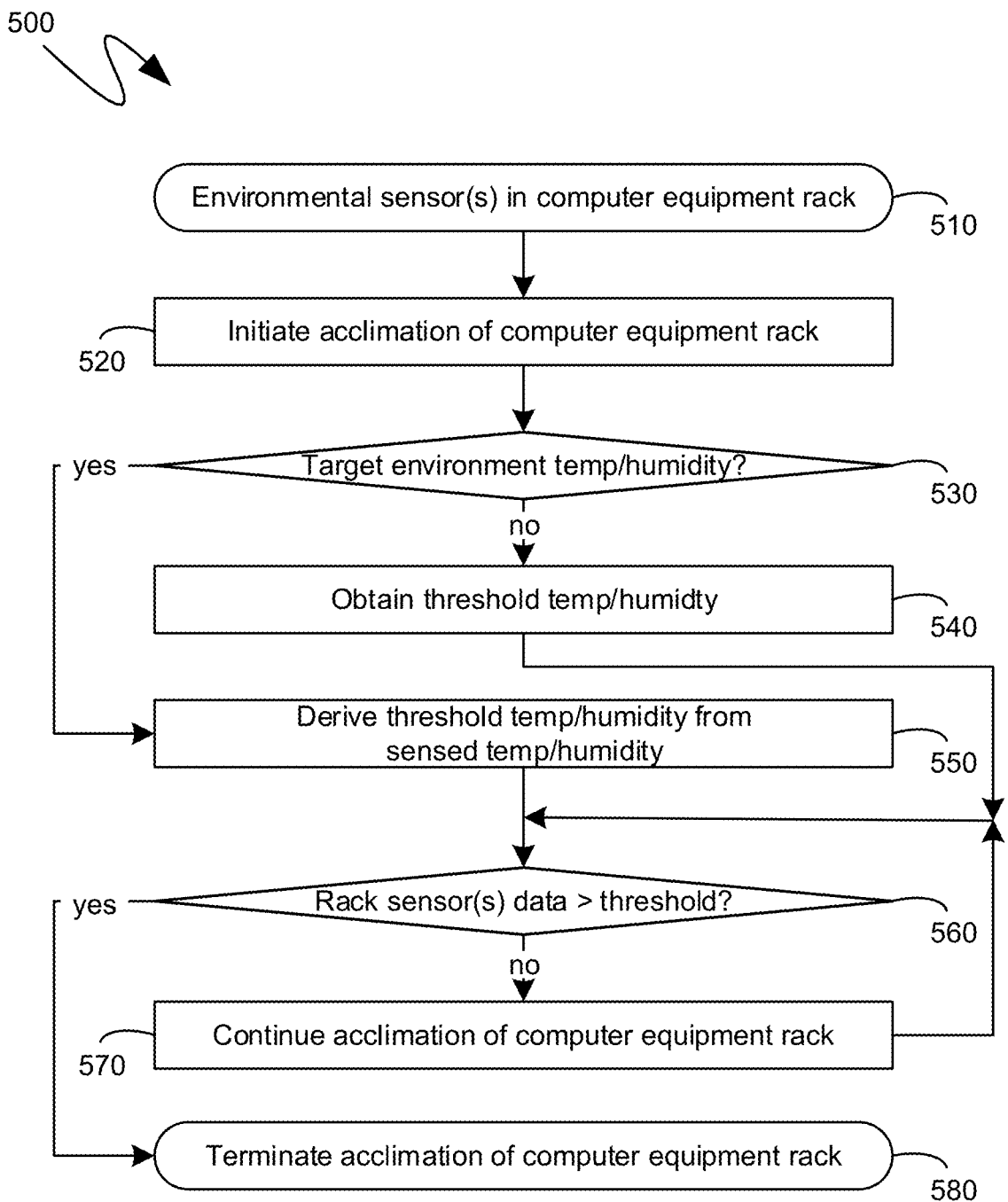
FIG. 5 is a flow diagram of an exemplary operation of a controller of an exemplary accelerated rack acclimator.

Turning to FIG. 5, the exemplary flow diagram 500 shown therein illustrates an exemplary series of steps that can be performed by the aforedescribed controller, which can be in the form of a hardwired controller, a computing device executing computer-executable instructions, or combinations thereof. Initially, at step 510, the controller can verify receipt of actionable data, such as sensed temperature or humidity, from one or more environmental sensors installed within the computer equipment rack, such as among the computing devices and other devices installed within the computer equipment rack. At step 520, acclimation of the computer equipment rack to an environment within which the computer equipment rack will be installed and utilized, can be initiated. As indicated previously, such an initiation, at step 520, can include the activation, or increasing, of the operation of an air mover, and one or more heating elements. At step 530, a determination can be made as to whether temperature and/or humidity are available from environmental sensors within the target environment to which the to which the computer equipment rack is being acclimated. As indicated previously, according to one aspect, one or more environmental sensors can directly monitor the temperature and/or humidity of such environment. Alternatively, as also indicated previously, such environmental sensors can be optional and a threshold temperature and/or humidity can be predetermined, such as based on previously collected empirical data and/or analysis. Thus, at step 530, if no such environmental sensors are directly monitoring the temperature and/or humidity of the target environment, then processing can proceed to step 540 and a predetermined threshold temperature and/or humidity can be obtained, such as from a memory of the controller, or from a remote storage destination which can be updated based on more recently obtained empirical data. Conversely, if, at step 530, environmental sensors directly monitoring the temperature and/or humidity of the target environment are available, the controller can proceed to step 550 and derive a threshold temperature and/or humidity from the sensed temperature and/or humidity. For example, the controller can, at step 550, derive a threshold temperature that is at least as high as the sensed or derived dewpoint of the target environment. As another example, the controller can, at step 550, derive a threshold temperature that is at least 10° F. higher than the dewpoint of the target environment. Other like threshold temperatures can similarly be derived at step 550.

Processing can then proceed to step 560, where the controller can determine whether the sensed environmental data, such as the sensed temperature, from the environmental sensors in the computer equipment rack, indicates that the temperature has exceeded the threshold from either step 540 or step 550. If, at step 560, the controller determines that the sensed environmental data has not yet met or exceeded the threshold, then the acclimation of the computer equipment rack can continue at step 570, such as by the controller continuing to operate the heating elements and/or air movers. Processing can then return to step 560. Conversely, if, at step 560, the sensed environmental data from the environmental sensors in the computer equipment rack indicates that the threshold has been reached or exceeded, acclimation of the computer equipment rack can be terminated at step 580, such as by the controller decreasing or ending the operation of one or more of the heating elements and/or air movers.

Figure 6:
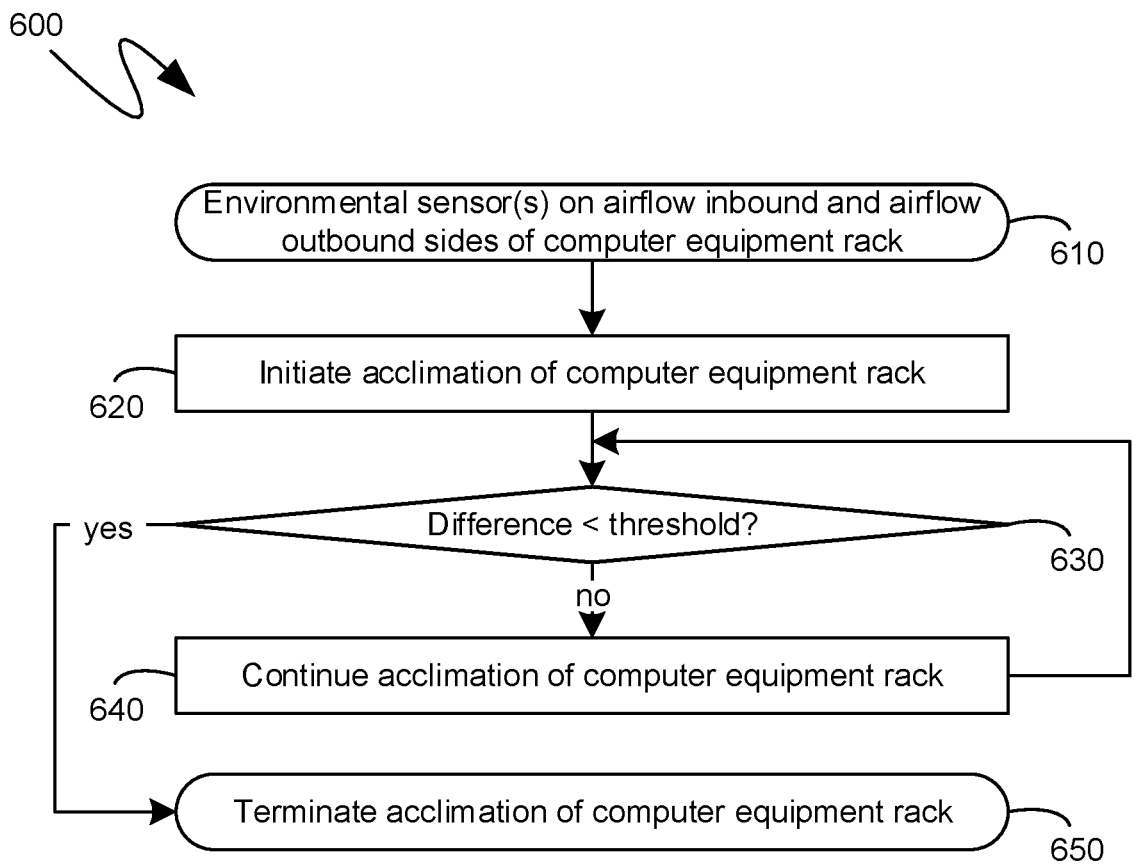
FIG. 6 is a flow diagram of another exemplary operation of a controller of an exemplary accelerated rack acclimator.

Turning to FIG. 6, the exemplary flow diagram 600 shown therein illustrates an exemplary series of steps that can be performed by the controller to acclimatize a computer equipment rack based on a differential between environmental data obtained from air being forced into the computer equipment rack for purposes of acclimatizing it, and air exiting the computer equipment rack. More specifically, and as indicated previously, an increased temperature differential, or humidity differential, between air being forced into a computer equipment rack for purposes of acclimatizing it, and air exiting the computer equipment rack, can be indicative of heat still being absorbed by the computer equipment rack and the devices installed therein, in other words that the computer equipment rack and devices are still being heated, or can be indicative of moisture still being released by the computer equipment rack and the devices installed therein.

Accordingly, at step 610, the controller can verify receipt of actionable data, such as sensed temperature and/or humidity, from environmental sensors positioned within the airflow into a computer equipment rack and the airflow out of a computer equipment rack. If such environmental sensors are present and communicating with the controller, processing can proceed to step 620, where acclimation of the computer equipment rack to an environment within which the computer equipment rack will be installed and utilized, can be initiated. As indicated previously, such an initiation, at step 620, can include the activation, or increasing, of the operation of an air mover, and one or more heating elements. At step 630, a determination can be made as to whether the difference between the environmental data, such as the temperature or humidity, of the air being forced into the computer equipment rack and the environmental data of the air flowing out of the computer equipment rack is below a threshold. If, at step 630, is it is determined that such a difference is still greater than the threshold, then such an increased difference can be indicative of the computer equipment rack continuing to be acclimatized, and the acclimation of the computer equipment rack can continue at step 640. Processing can then return to step 630. Conversely, if, at step 630, the difference between the environmental data of the air being forced into the computer equipment rack and the environmental data of the air flowing out of the computer equipment rack is below a threshold, then acclimation of the computer equipment rack can be terminated at step 650, such as by the controller decreasing or ending the operation of one or more of the heating elements and/or air movers.

Figure 7:
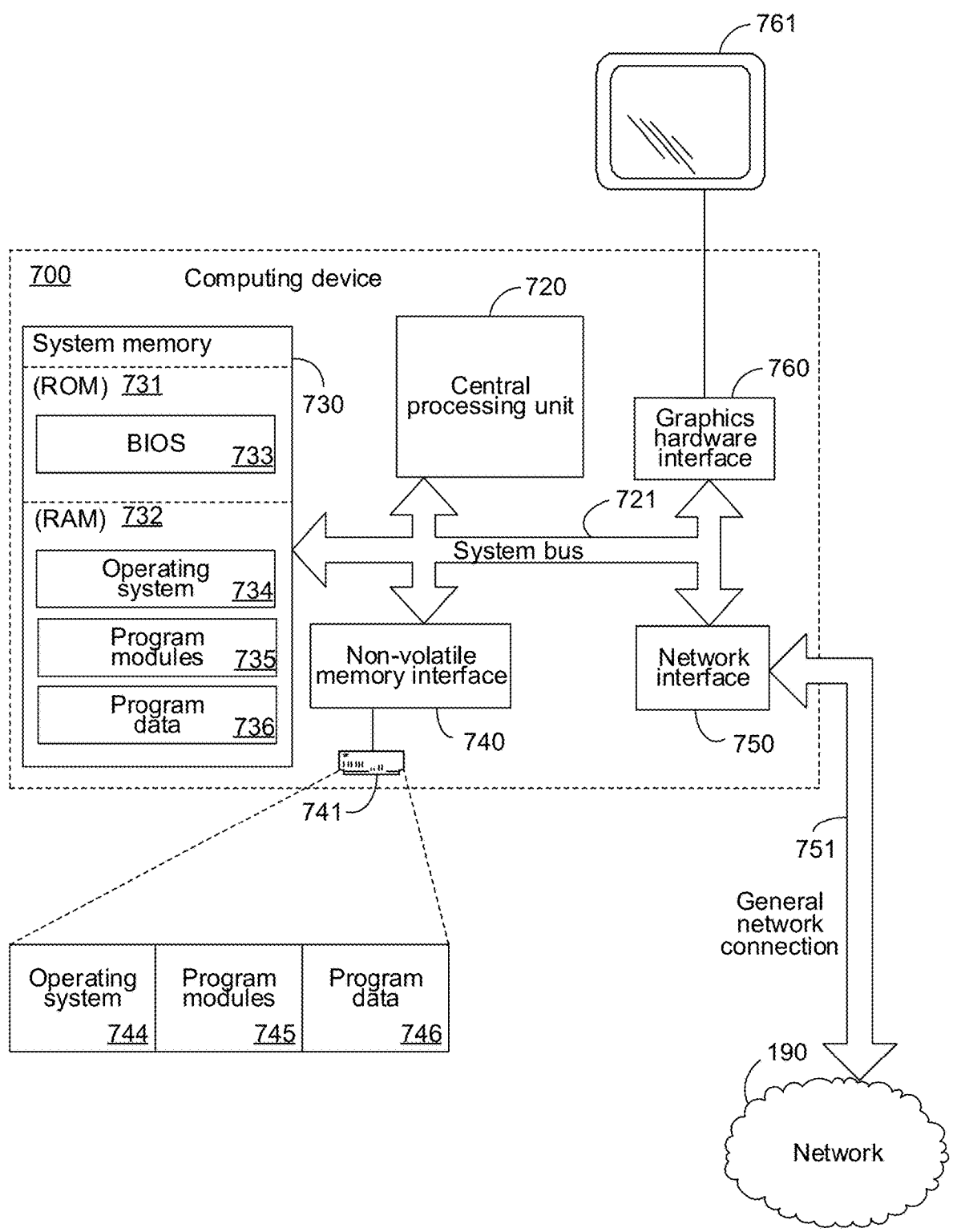
FIG. 7 is a diagram of an exemplary computing device that can provide control of an exemplary accelerated rack acclimator.

Turning to FIG. 7, an exemplary computing device 700 is illustrated which can act as the controller described above. The exemplary computing device 700 can include, but is not limited to, one or more central processing units (CPUs) 720, a system memory 730, and a system bus 721 that couples various system components including the system memory to the processing unit 720. The system bus 721 may be any of several types of bus structures including a memory bus or memory controller, a peripheral bus, and a local bus using any of a variety of bus architectures. The computing device 700 can optionally include graphics hardware, including, but not limited to, a graphics hardware interface 760 and a display device 761, which can include display devices capable of receiving touch-based user input, such as a touch-sensitive, or multi-touch capable, display device. The display device 761 can further include a virtual reality display device, which can be a virtual reality headset, a mixed reality headset, an augmented reality headset, and other like virtual reality display devices. As will be recognized by those skilled in the art, such virtual reality display devices comprise either two physically separate displays, such as LCD displays, OLED displays or other like displays, where each physically separate display generates an image presented to a single one of a user's two eyes, or they comprise a single display device associated with lenses or other like visual hardware that divides the display area of such a single display device into areas such that, again, each single one of the user's two eyes receives a slightly different generated image. The differences between such generated images are then interpreted by the user's brain to result in what appears, to the user, to be a fully three-dimensional environment.

Returning to FIG. 7, depending on the specific physical implementation, one or more of the CPUs 720, the system memory 730 and other components of the computing device 700 can be physically co-located, such as on a single chip. In such a case, some or all of the system bus 721 can be nothing more than silicon pathways within a single chip structure and its illustration in FIG. 7 can be nothing more than notational convenience for the purpose of illustration.

The computing device 700 also typically includes computer readable media, which can include any available media that can be accessed by computing device 700 and includes both volatile and nonvolatile media and removable and non-removable media. By way of example, and not limitation, computer readable media may comprise computer storage media and communication media. Computer storage media includes media implemented in any method or technology for storage of content such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired content and which can be accessed by the computing device 700. Computer storage media, however, does not include communication media. Communication media typically embodies computer readable instructions, data structures, program modules or other data in a modulated data signal such as a carrier wave or other transport mechanism and includes any content delivery media. By way of example, and not limitation, communication media includes wired media such as a wired network or direct-wired connection, and wireless media such as acoustic, RF, infrared and other wireless media. Combinations of the any of the above should also be included within the scope of computer readable media.

The system memory 730 includes computer storage media in the form of volatile and/or nonvolatile memory such as read only memory (ROM) 731 and random access memory (RAM) 732. A basic input/output system 733 (BIOS), containing the basic routines that help to transfer content between elements within computing device 700, such as during start-up, is typically stored in ROM 731. RAM 732 typically contains data and/or program modules that are immediately accessible to and/or presently being operated on by processing unit 720. By way of example, and not limitation, FIG. 7 illustrates operating system 734, other program modules 735, and program data 736.

The computing device 700 may also include other removable/non-removable, volatile/nonvolatile computer storage media. By way of example only, FIG. 7 illustrates a hard disk drive 741 that reads from or writes to non-removable, nonvolatile magnetic media. Other removable/non-removable, volatile/nonvolatile computer storage media that can be used with the exemplary computing device include, but are not limited to, magnetic tape cassettes, flash memory cards, digital versatile disks, digital video tape, solid state RAM, solid state ROM, and other computer storage media as defined and delineated above. The hard disk drive 741 is typically connected to the system bus 721 through a non-volatile memory interface such as interface 740.

The drives and their associated computer storage media discussed above and illustrated in FIG. 7, provide storage of computer readable instructions, data structures, program modules and other data for the computing device 700. In FIG. 7, for example, hard disk drive 741 is illustrated as storing operating system 744, other program modules 745, and program data 746. Note that these components can either be the same as or different from operating system 734, other program modules 735 and program data 736. Operating system 744, other program modules 745 and program data 746 are given different numbers hereto illustrate that, at a minimum, they are different copies.

The computing device 700 may operate in a networked environment using logical connections to one or more remote computers. The computing device 700 is illustrated as being connected to the general network connection 751 (to the network 190) through a network interface or adapter 750, which is, in turn, connected to the system bus 721. In a networked environment, program modules depicted relative to the computing device 700, or portions or peripherals thereof, may be stored in the memory of one or more other computing devices that are communicatively coupled to the computing device 700 through the general network connection 751. It will be appreciated that the network connections shown are exemplary and other means of establishing a communications link between computing devices may be used.

Although described as a single physical device, the exemplary computing device 700 can be a virtual computing device, in which case the functionality of the above-described physical components, such as the CPU 720, the system memory 730, the network interface 740, and other like components can be provided by computer-executable instructions. Such computer-executable instructions can execute on a single physical computing device, or can be distributed across multiple physical computing devices, including being distributed across multiple physical computing devices in a dynamic manner such that the specific, physical computing devices hosting such computer-executable instructions can dynamically change over time depending upon need and availability. In the situation where the exemplary computing device 700 is a virtualized device, the underlying physical computing devices hosting such a virtualized computing device can, themselves, comprise physical components analogous to those described above, and operating in a like manner. Furthermore, virtual computing devices can be utilized in multiple layers with one virtual computing device executing within the construct of another virtual computing device. The term "computing device", therefore, as utilized herein, means either a physical computing device or a virtualized computing environment, including a virtual computing device, within which computer-executable instructions can be executed in a manner consistent with their execution by a physical computing device. Similarly, terms referring to physical components of the computing device, as utilized herein, mean either those physical components or virtualizations thereof performing the same or equivalent functions.

The descriptions above include, as a first example, a rack acclimating device comprising: one or more heating elements; an air mover oriented to move air across the one or more heating elements; a hood having a first opening proximate to the air mover and a second opening having a size conforming to a computer equipment rack sizing standard; one or more environmental sensors, each sensing at least one of a temperature or a humidity; and a controller communicationally coupled to the one or more environmental sensors, the controller being configured to decrease or deactivate operation of at least one of the one or more heating elements or the air mover in response to the at least one of the temperature or the humidity received from each of the one or more environmental sensors.

A second example is the rack acclimating device of the first example, wherein the second opening of the hood is opposite the first opening.

A third example is the rack acclimating device of the first example, wherein the first opening of the hood is circular and the second opening of the hood is rectangular.

A fourth example is the rack acclimating device of the first example, wherein the computer equipment rack sizing standard to which the second opening's size conforms is the 42U rack height standard and the 19 inch rack width standard.

A fifth example is the rack acclimating device of the first example, further comprising a foam gasket around a periphery of the second opening of the hood.

A sixth example is the rack acclimating device of the first example, further comprising one or more magnets positioned around a periphery of the second opening of the hood.

A seventh example is the rack acclimating device of the first example, further comprising a wheel frame to which the hood is attached.

An eighth example is the rack acclimating device of the first example, wherein the one or more heating elements comprise a dedicated electric heater and the air mover is a fan, the rack acclimating device further comprising a housing encasing both the dedicated electric heater and the fan, the housing having a first opening from which the fan draws the air and a second opening through which the fan exhausts the air after moving the air across the dedicated electric heater; and wherein further the first opening of the hood being proximate to the air mover comprises the first opening of the hood being proximate to the second opening of the housing.

A ninth example is the rack acclimating device of the eighth example, further comprising a duct having a first opening positioned outside of a building housing the rack acclimating device and a second opening positioned proximate to the first opening of the housing.

A tenth example is the rack acclimating device of the first example, wherein the air mover comprises one or more fans of computer equipment of a first computer equipment rack being acclimated by the rack acclimating device.

An eleventh example is the rack acclimating device of the tenth example, wherein the one or more fans of the computer equipment of the first computer equipment rack are powered by a separate power supply system from other electrical components of the computer equipment of the first computer equipment rack.

A twelfth example is the rack acclimating device of the tenth example, wherein the computer equipment of the first computer equipment rack comprises supplemental fans that cool the computer equipment of the first computer equipment rack, the supplemental fans being independent of the one or more fans of the computer equipment of the first computer equipment rack, the supplemental fans not being part of the air mover of the rack acclimating device.

A thirteenth example is the rack acclimating device of the first example, wherein: the one or more heating elements comprise one or more processors of one or more operational server computing devices; the air mover comprises one or more fans of the one or more operational server computing devices; and the first opening of the hood is positioned in a hot aisle into which the one or more fans of the one or more operational server computing devices vent heat generated by the one or more processors of the one or more operational server computing devices.

A fourteenth example is the rack acclimating device of the thirteenth example, further comprising a dehumidifier positioned proximate to the first opening of the hood.

A fifteenth example is the rack acclimating device of the first example, wherein the one or more environmental sensors comprise one or more computer equipment temperature sensors sensing temperatures of computer equipment of a first computer equipment rack being acclimated by the rack acclimating device; and wherein further the controller is configured to decrease or deactivate operation of at least one of the heating element or the air mover in response to the one or more computer equipment temperature sensors sensing that the temperatures of the computer equipment of the first computer equipment rack are all above a dew point of a climate-controlled, enclosed space to which the first computer equipment rack is being acclimated.

A sixteenth example is the rack acclimating device of the fifteenth example, wherein the one or more environmental sensors comprise at least one environmental sensor positioned inside the climate-controlled, enclosed space, the at least one environmental sensor sensing at least one of a temperature or a humidity of the climate-controlled, enclosed space, the dew point of the climate-controlled, enclosed space being derived from the at least one of the temperature or the humidity of the climate-controlled, enclosed space sensed by the at least one environmental sensor.

A seventeenth example is the rack acclimating device of the fifteenth example, wherein the dew point of the climate-controlled, enclosed space is a pre-determined threshold applicable to both the climate-controlled, enclosed space and to other climate-controlled, enclosed spaces.

An eighteenth example is the rack acclimating device of the first example, wherein the one or more environmental sensors comprise: a first environmental sensor sensing at least one of a rack-inbound air temperature or a rack-inbound air humidity; and a second environmental sensor sensing at least one of a rack-outbound air temperature or a rack-outbound air humidity; wherein further the controller is configured to decrease or deactivate operation of at least one of the one or more heating elements or the air mover in response to detecting that a difference between the at least one of the rack-inbound air temperature or the rack-inbound air humidity and the at least one of the rack-outbound air temperature or the rack-outbound air humidity is below a first threshold.

A nineteenth example is a method of acclimating a rack of computing equipment to an operating environment, the method comprising: receiving the rack of computing equipment in an environmental state that differs from the operating environment in that either: (1) at least some of the environmental state of the rack of computing equipment is colder than a dew point of the operating environment or (2) at least some of the environmental state of the rack of computing equipment has a dew point above a temperature of the operating environment; coupling a second opening of a hood of a rack acclimating device to the rack of computing equipment; and operating the rack acclimating device to either heat the rack of computing equipment above a threshold temperature or dry the rack of computing equipment below a threshold humidity; wherein the rack acclimating device comprises: one or more heating elements; an air mover oriented to move air across the one or more heating elements; the hood having a first opening proximate to the air mover and the second opening having a size conforming to the rack of computer equipment; one or more environmental sensors, each sensing at least one of a temperature or a humidity; and a controller communicationally coupled to the one or more environmental sensors, the controller being configured to decrease or deactivate operation of at least one of the one or more heating elements or the air mover in response to the at least one of the air temperature or the air humidity received from each of the one or more environmental sensors.

A twentieth example is a computing device comprising: one or more processing units; and one or more computer-readable media comprising computer-executable instructions, which, when executed, cause the computing device to: receive, from individual ones of one or more environmental sensors, either a temperature or a humidity sensed by each of the individual ones of the one or more environmental sensors; and generate control signals to at least one of: one or more heating elements or an air mover based on the received temperature or humidity; wherein the one or more heating elements and the air mover are part of a rack acclimating device being controlled by the computing device, the rack acclimating device further comprising a hood having a first opening proximate to the air mover and a second opening having a size conforming to a computer equipment rack sizing standard.

As can be seen from the above descriptions, an accelerated rack acclimation mechanism has been presented. In view of the many possible variations of the subject matter described herein, we claim as our invention all such embodiments as may come within the scope of the following claims and equivalents thereto.

We claim:

1. A rack acclimating device comprising:
   one or more heating elements;
   an air mover oriented to move air across the one or more heating elements;
   a hood having a first opening proximate to the air mover and a second opening having a size conforming to a computer equipment rack sizing standard;
   one or more environmental sensors, each sensing at least one of a temperature or a humidity; and
   a controller communicationally coupled to the one or more environmental sensors, the controller being configured to decrease or deactivate operation of at least one of the one or more heating elements or the air mover in response to the at least one of the temperature or the humidity received from each of the one or more environmental sensors.

2. The rack acclimating device of claim 1, wherein the second opening of the hood is opposite the first opening.

3. The rack acclimating device of claim 1, wherein the first opening of the hood is circular and the second opening of the hood is rectangular.

4. The rack acclimating device of claim 1, wherein the computer equipment rack sizing standard to which the second opening's size conforms is the 42U rack height standard and the 19 inch rack width standard.

5. The rack acclimating device of claim 1, further comprising a foam gasket around a periphery of the second opening of the hood.

6. The rack acclimating device of claim 1, further comprising one or more magnets positioned around a periphery of the second opening of the hood.

7. The rack acclimating device of claim 1, further comprising a wheel frame to which the hood is attached.

8. The rack acclimating device of claim 1, wherein the one or more heating elements comprise a dedicated electric heater and the air mover is a fan, the rack acclimating device further comprising a housing encasing both the dedicated electric heater and the fan, the housing having a first opening from which the fan draws the air and a second opening through which the fan exhausts the air after moving the air across the dedicated electric heater;

and wherein further the first opening of the hood being proximate to the air mover comprises the first opening of the hood being proximate to the second opening of the housing.

9. The rack acclimating device of claim 8, further comprising a duct having a first opening positioned outside of a building housing the rack acclimating device and a second opening positioned proximate to the first opening of the housing.

10. The rack acclimating device of claim 1, wherein the air mover comprises one or more fans of computer equipment of a first computer equipment rack being acclimated by the rack acclimating device.

11. The rack acclimating device of claim 10, wherein the one or more fans of the computer equipment of the first computer equipment rack are powered by a separate power supply system from other electrical components of the computer equipment of the first computer equipment rack.

12. The rack acclimating device of claim 10, wherein the computer equipment of the first computer equipment rack comprises supplemental fans that cool the computer equipment of the first computer equipment rack, the supplemental fans being independent of the one or more fans of the computer equipment of the first computer equipment rack, the supplemental fans not being part of the air mover of the rack acclimating device.

13. The rack acclimating device of claim 1, wherein:
the one or more heating elements comprise one or more processors of one or more operational server computing devices;
the air mover comprises one or more fans of the one or more operational server computing devices; and
the first opening of the hood is positioned in a hot aisle into which the one or more fans of the one or more operational server computing devices vent heat generated by the one or more processors of the one or more operational server computing devices.

14. The rack acclimating device of claim 13, further comprising a dehumidifier positioned proximate to the first opening of the hood.

15. The rack acclimating device of claim 1, wherein the one or more environmental sensors comprise one or more computer equipment temperature sensors sensing temperatures of computer equipment of a first computer equipment rack being acclimated by the rack acclimating device; and
wherein further the controller is configured to decrease or deactivate operation of at least one of the heating element or the air mover in response to the one or more computer equipment temperature sensors sensing that the temperatures of the computer equipment of the first computer equipment rack are all above a dew point of a climate-controlled, enclosed space to which the first computer equipment rack is being acclimated.

16. The rack acclimating device of claim 15, wherein the one or more environmental sensors comprise at least one environmental sensor positioned inside the climate-controlled, enclosed space, the at least one environmental sensor sensing at least one of a temperature or a humidity of the climate-controlled, enclosed space, the dew point of the climate-controlled, enclosed space being derived from the at least one of the temperature or the humidity of the climate-controlled, enclosed space sensed by the at least one environmental sensor.

17. The rack acclimating device of claim 15, wherein the dew point of the climate-controlled, enclosed space is a pre-determined threshold applicable to both the climate-controlled, enclosed space and to other climate-controlled, enclosed spaces.

18. The rack acclimating device of claim 1, wherein the one or more environmental sensors comprise:
a first environmental sensor sensing at least one of a rack-inbound air temperature or a rack-inbound air humidity; and
a second environmental sensor sensing at least one of a rack-outbound air temperature or a rack-outbound air humidity;
wherein further the controller is configured to decrease or deactivate operation of at least one of the one or more heating elements or the air mover in response to detecting that a difference between the at least one of the rack-inbound air temperature or the rack-inbound air humidity and the at least one of the rack-outbound air temperature or the rack-outbound air humidity is below a first threshold.

19. A method of acclimating a rack of computing equipment to an operating environment, the method comprising:
receiving the rack of computing equipment in an environmental state that differs from the operating environment in that either: (1) at least some of the environmental state of the rack of computing equipment is colder than a dew point of the operating environment or (2) at least some of the environmental state of the rack of computing equipment has a dew point above a temperature of the operating environment;
coupling a second opening of a hood of a rack acclimating device to the rack of computing equipment; and
operating the rack acclimating device to either heat the rack of computing equipment above a threshold temperature or dry the rack of computing equipment below a threshold humidity;
wherein the rack acclimating device comprises:
one or more heating elements;
an air mover oriented to move air across the one or more heating elements;
the hood having a first opening proximate to the air mover and the second opening having a size conforming to the rack of computer equipment;
one or more environmental sensors, each sensing at least one of a temperature or a humidity; and a controller communicationally coupled to the one or more environmental sensors, the controller being configured to decrease or deactivate operation of at least one of the one or more heating elements or the air mover in response to the at least one of the air temperature or the air humidity received from each of the one or more environmental sensors.

20. A computing device comprising:

one or more processing units; and one or more computer-readable media comprising computer-executable instructions, which, when executed, cause the computing device to:
- receive, from individual ones of one or more environmental sensors, either a temperature or a humidity sensed by each of the individual ones of the one or more environmental sensors; and
- generate control signals to at least one of: one or more heating elements or an air mover based on the received temperature or humidity;

wherein the one or more heating elements and the air mover are part of a rack acclimating device being controlled by the computing device, the rack acclimating device further comprising a hood having a first opening proximate to the air mover and a second opening having a size conforming to a computer equipment rack sizing standard.

* * * * *